US006438237B1

(12) United States Patent
Nakamura

(10) Patent No.: US 6,438,237 B1
(45) Date of Patent: Aug. 20, 2002

(54) 3D WOOFER DRIVE CIRCUIT

(75) Inventor: Takeshi Nakamura, Uji (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/349,878

(22) Filed: Jul. 8, 1999

(30) Foreign Application Priority Data

Oct. 1, 1998 (JP) .......................................... 10-279716

(51) Int. Cl.[7] ............................ H04R 5/00; H03G 5/00
(52) U.S. Cl. ........................................... 381/27; 381/99
(58) Field of Search ............................ 381/98, 99, 111, 381/115, 116, 117, 27

(56) References Cited

U.S. PATENT DOCUMENTS 3,184,550 A 5/1965 Rogers
3,657,480 A * 4/1972 Cheng et al. ................ 381/99
4,024,344 A * 5/1977 Dolby et al. ................. 381/27
4,408,095 A 10/1983 Ariga et al.
4,443,889 A * 4/1984 Norgaard
4,593,405 A * 6/1986 Frye et al. .................... 381/99
4,771,466 A 9/1988 Modafferi
4,850,021 A * 7/1989 Sparkjaer ..................... 381/22
5,297,212 A * 3/1994 Murayama et al. ........... 381/86

FOREIGN PATENT DOCUMENTS

JP 59-119669 8/1984
JP 59-119689 8/1984
JP 59-195897 12/1984
JP 60-35878 8/1985
JP 3-145897 6/1991

* cited by examiner

*Primary Examiner*—Forester W. Isen
*Assistant Examiner*—Brian Tyrone Pendleton
(74) *Attorney, Agent, or Firm*—Keating & Bennett, LLP

(57) ABSTRACT

A 3D woofer drive circuit achieves miniaturization of a 3D sound system and reduces the cost thereof. The drive circuit includes two resistors arranged to synthesize an L-channel sound signal with an R-channel sound signal. Each end of a capacitor constituting part of a low pass filter and two fixed terminals of a variable resistor are respectively connected between a connection point of the resistors and a ground terminal which is a reference potential. A speaker terminal for the woofer is connected to a movable terminal of the variable resistor through a buffer amplifier.

30 Claims, 4 Drawing Sheets

3D WOOFER DRIVE CIRCUIT

BACKGROUND OF THE INVENTION

1. Field of the Invention

The present invention relates to a 3D woofer drive circuit, and more specifically, to a 3D woofer drive circuit arranged to drive a woofer which is a speaker for a low frequency range in the center of a 3D sound system.

2. Description of the Related Art

FIG. 3 is a circuit diagram illustrating an example of a conventional 3D sound system relating to a background of the present invention. The conventional 3D sound system 1 shown in FIG. 3 includes two input terminals 2*a* and 2*b*.

Two inductors 3*a* and 3*b* are connected in series between the two input terminals 2*a* and 2*b*. A capacitor 4 is connected between a connection point of the two inductors 3*a* and 3*b* and a ground terminal which is a reference potential. A variable resistor 6 is connected to each end of the capacitor 4 and to two speaker terminals 5 for a woofer.

A capacitor 7*a* and an inductor 8*a* are connected to each other in series between the input terminal 2*a* and the ground terminal, and two speaker terminals 9*a* for an L-channel speaker are connected to each end of the inductor 8*a*.

Similarly, a capacitor 7*b* and an inductor 8*b* are connected to each other in series between the input terminal 2*b* and the ground terminal, and two speaker terminals 9*b* for an R-channel speaker are connected to each end of the inductor 8*b*.

In this 3D sound system 1, a woofer is connected to the speaker terminals 5, an L-channel speaker for medium to high frequency range is connected to the speaker terminals 9*a*, and an R-channel speaker for medium to high frequency range is connected to the speaker terminals 9*b*.

In this 3D sound system 1, an L-channel sound signal is input between the input terminal 2*a* and the ground terminal, while an R-channel sound signal is input between the input terminal 2*b* and the ground terminal. Thus, the low frequency range sound signal among the sound signals in which the L-channel sound signal is synthesized with the R-channel sound signal is converted into sound by the woofer, the medium to high frequency range sound signal in the L-channel sound signal is converted into sound by the medium to high frequency range L-channel speaker, and the medium to high frequency range sound signal in the R-channel sound signal is converted into sound by the medium to high frequency range R-channel speaker.

FIG. 4 is a circuit diagram illustrating another example of a conventional 3D sound system relating to the background of the present invention. A conventional 3D sound system 11 illustrated in FIG. 4 includes a pre-amplifier 12. The pre-amplifier 12 is provided with two input terminals 13*a* and 13*b* and two output terminals 14*a* and 14*b*.

Two resistors 15*a* and 15*b* are connected in series between the two output terminals 14*a* and 14*b* of the pre-amplifier 12. A capacitor 16 is connected between the connection point of the two resistors 15*a* and 15*b* and the ground terminal which is the reference potential. Two speaker terminals 18 for the woofer are connected to each end of the capacitor 16 through a main amplifier 17.

A capacitor 19*a* and a resistor 20*a* are connected in series between the output. terminal 14*a* of the pre-amplifier 12 and the ground terminal, and two speaker terminals 22*a* for the L-channel speaker are connected to each end of the resistor 20*a* through a main amplifier 21*a*.

Similarly, a capacitor 19*b* and a resistor 20*b* are connected in series between the output terminal 14*b* of the pre-amplifier 12 and the ground terminal, and two speaker terminals 22*b* for the R-channel speaker are connected to each end of the resistor 20*b* through a main amplifier 21*b*.

In the 3D sound system 11, the woofer is connected to the speaker terminals 18, the medium to high frequency range L-channel speaker is connected to the speaker terminals 22*a*, and the medium to high frequency range R-channel speaker is connected to the speaker terminals 22*b*.

In the 3D sound system 11, the L-channel sound signal is input between the input terminal 13*a* of the pre-amplifier 12 and the ground terminal, and the sound signal of the R-channel is input between the input terminal 13*b* of the pre-amplifier 12 and the ground terminal. The low frequency range sound signal among the sound signals in which the L-channel sound signal is synthesized with the R-channel sound signal is converted into sound by the woofer, the medium to high frequency range sound signal in the L-channel sound signal is converted into sound by the medium to high frequency range L-channel speaker, and the medium to high frequency range sound signal in the R-channel sound signals is converted into sound by the medium to high frequency range R-channel speaker.

In the 3D sound system 1 illustrated in FIG. 3, the impedance of the woofer forming a load is low, and the values of the inductance and the capacitance of the inductors 3*a* and 3*b*, and the capacitor 4 constituting a network for the woofer are increased, the size is increased, and the power must also be considered.

Further, in the 3D sound system 1 illustrated in FIG. 3, the variable resistor 6 to regulate the level of the woofer must be impedance-matched with the woofer forming the load, and a specialized variable resistor must be used, its size is large, its cost is high, and the power must also be considered.

In addition, in the 3D sound system 1 illustrated in FIG. 3, if the tone of the woofer is to be adjusted, the tone must be adjusted at the woofer itself.

In the 3D sound system 11 illustrated in FIG. 4, a plurality of amplifiers including the pre-amplifier and the main amplifier are required to drive the woofer.

Also, in the 3D sound system 11 illustrated in FIG. 4, the construction of the driver for the woofer becomes complicated, and the whole system is increased in size and cost.

SUMMARY OF THE INVENTION

Accordingly, in order to overcome the problems described above, preferred embodiments of the present invention provide a 3D woofer drive circuit which miniaturizes a 3D sound system and greatly reduces the cost thereof.

A 3D woofer drive circuit according to preferred embodiments of the present invention for driving the woofer in the center of a 3D sound system includes an impedance element arranged to synthesize an L-channel sound signal with an R-channel sound signal and an amplifier arranged to output to the woofer the sound signal synthesized by the impedance element for driving the woofer.

In the 3D woofer drive circuit of preferred embodiments of the present invention, the impedance element includes a resistor, a capacitor connected to the resistor, and a low pass filter arranged to control the frequency of the sound signal to be output to the woofer by the resistor and the capacitor may be provided. In this case, a variable resistor which also has the function of an attenuator and a tone control may be used as the resistor to be used in the low pass filter.

In the 3D woofer drive circuit of preferred embodiments of the present invention, the L-channel sound signal is synthesized with the R-channel sound signal via the impedance element, the synthesized sound signal is output to the woofer by the amplifier, thus driving the woofer, and the sound signal is converted into sound by the woofer.

In preferred embodiments of the present invention, it is not necessary that the network for the woofer include the inductor and the capacitor, and a plurality of amplifiers to drive the woofer can be eliminated, and the constitution of the 3D woofer drive circuit is thereby greatly simplified. Thus, the 3D sound system is miniaturized and the cost is reduced if the 3D woofer drive circuit of preferred embodiments of the present invention is used in the 3D sound system.

The above-mentioned elements, features, characteristics and advantages of the present invention are further clarified by the following detailed description of preferred embodiments referring to the drawings.

DETAILED DESCRIPTION OF PREFERRED EMBODIMENTS

Figure 1:
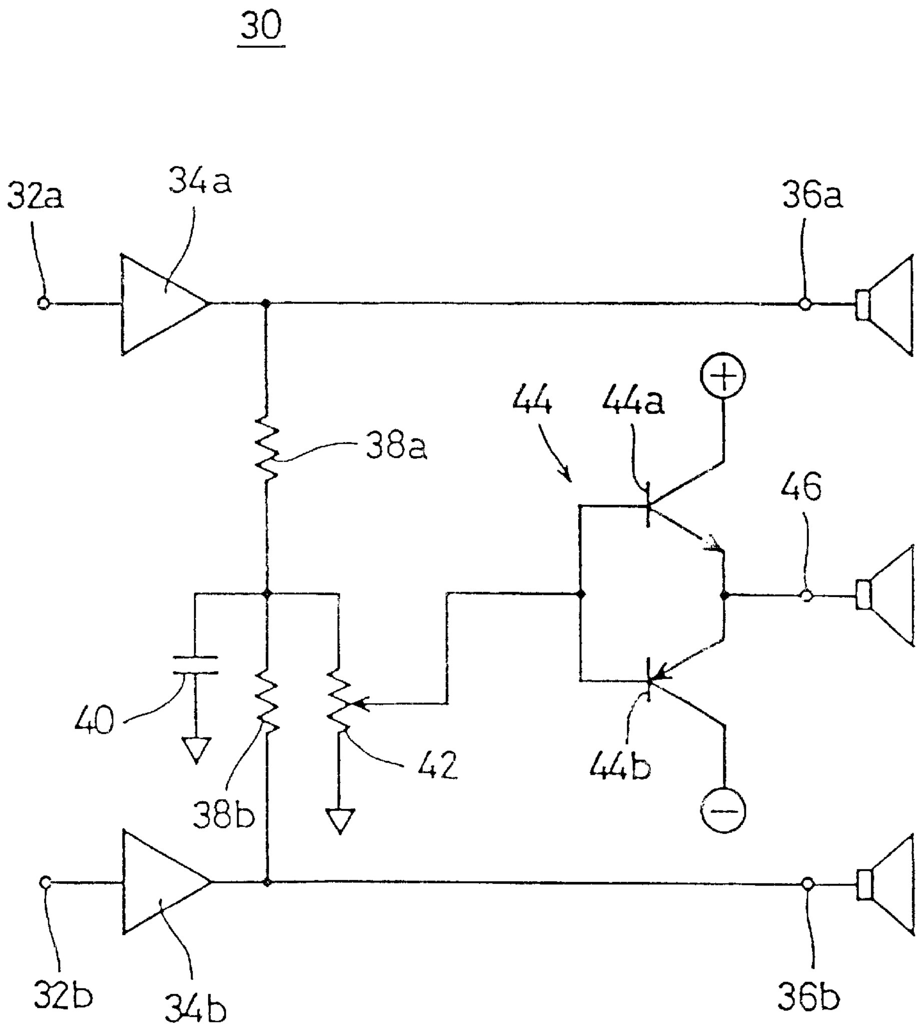
FIG. 1 is a circuit diagram illustrating an example of a 3D sound system using a 3D woofer drive circuit according to a preferred embodiment of the present invention.

FIG. 1 is a schematic diagram illustrating an example of a 3D sound system using a 3D woofer drive circuit according to a preferred embodiment of the present invention. A 3D sound system 30 illustrated in FIG. 1 includes two input terminals 32*a* and 32*b*.

A speaker terminal 36*a* for an L-channel speaker is connected to the input terminal 32*a* via a power amplifier 34*a*.

Similarly, a speaker terminal 36*b* for an R-channel speaker is connected to the input terminal 32*b* via a power amplifier 34*b*.

Two resistors 38*a* and 38*b* defining impedance elements constituting a part of the 3D woofer drive circuit are connected in series between output terminals of the two power amplifiers 34*a* and 34*b*. A capacitor 40 constituting a low pass filter together with the resistors 38*a* and 38*b* is connected between the connection point of the two resistors 38*a* and 38*b* and a ground terminal defining a reference potential. Two fixed terminals of a variable resistor 42 which functions as an attenuator and a tone control are connected to each end of the capacitor 40. A speaker terminal 46 for the woofer is connected to a movable terminal of the variable resistor 42 via a buffer amplifier 44. The buffer amplifier 44 includes an NPN-type transistor 44*a* and a PNP-type transistor 44*b*. A base of the transistor 44*a* and a base of the transistor 44*b* are connected to the movable terminal of the variable resistor 42, a collector of the transistor 44*a* is connected to a positive electric potential terminal, a collector of the transistor 44*b* is connected to a negative electric potential terminal, and an emitter of the transistor 44*a* and an emitter of the transistor 44*b* are connected to the speaker terminal 46.

In the 3D sound system 30 illustrated in FIG. 1, a medium to high frequency range L-channel speaker is connected between the speaker terminal 36*a* and the ground terminal, a medium to high frequency range R-channel speaker is connected between the speaker terminal 36*b* and the ground terminal, and the woofer is connected between the speaker terminal 46 and the ground terminal.

In the 3D sound system 30 illustrated in FIG. 1, an L-channel sound signal is input between the input terminal 32*a* and the ground terminal, and an R-channel sound signal is input between the input terminal 32*b* and the ground terminal. The L-channel sound signal is amplified by the power amplifier 34*a*, and the medium to high frequency range sound signal among the amplified sound signals is converted into sound by the medium to high frequency range L-channel speaker. Similarly, the R-channel sound signal is amplified by the power amplifier 34*b*, and the medium to high frequency range sound signal among the amplified sound signals is converted into sound by the medium to high frequency range R-channel speaker. In addition, the amplified L-channel sound signal is synthesized with the amplified R-channel sound signal by the resistors 38*a* and 38*b*, and the low frequency range sound signal among the synthesized sound signals is passed through the low pass filter including the resistors 38*a* and 38*b*, the capacitor 40, and the variable resistor 42, and is output to the woofer through the buffer amplifier 44, thus driving the woofer, and the sound signal is converted into sound by the woofer.

In the 3D sound system 30 illustrated in FIG. 1, it is unnecessary to provide a network for the woofer using inductors and capacitors, a plurality of amplifiers for driving the woofer can be eliminated, and the construction of the 3D woofer drive circuit is greatly simplified. Thus, the 3D sound system 30 can be miniaturized and the cost thereof reduced.

Further, in the 3D sound system 30 illustrated in FIG. 1, the tone can be controlled by moving the movable terminal of the variable resistor 42 to change the level of the sound from the woofer. In this case, the level of the sound from the woofer is increased as the resistance between the fixed terminal connected to the ground terminal and the movable terminal in the variable resistor 42 is increased. The cut-off frequency $f_c$ of the low pass filter defined by the resistors 38*a* and 38*b*, the capacitor 40, and the variable resistor 42 is expressed by the equation: $f_c=1/\{2\pi C(R1//R2//R3)\}$, where $R1//R2//R3$ means $1/\{(1/R1)+(1/R2)+(1/R3)\}$, R1 is the resistance of the resistor 38*a*, R2 is the resistance of the resistor 38*b*, C is the capacitance of the capacitor 40, and R3 is the resistance between the two fixed terminals of the variable resistor 42. That is, the cut-off frequency is not changed even when the movable terminals of the variable resistor 42 are moved, and an effect similar to tone control can be performed by increasing/decreasing the sound, i.e., the sound in the low frequency range from the woofer.

Figure 2:
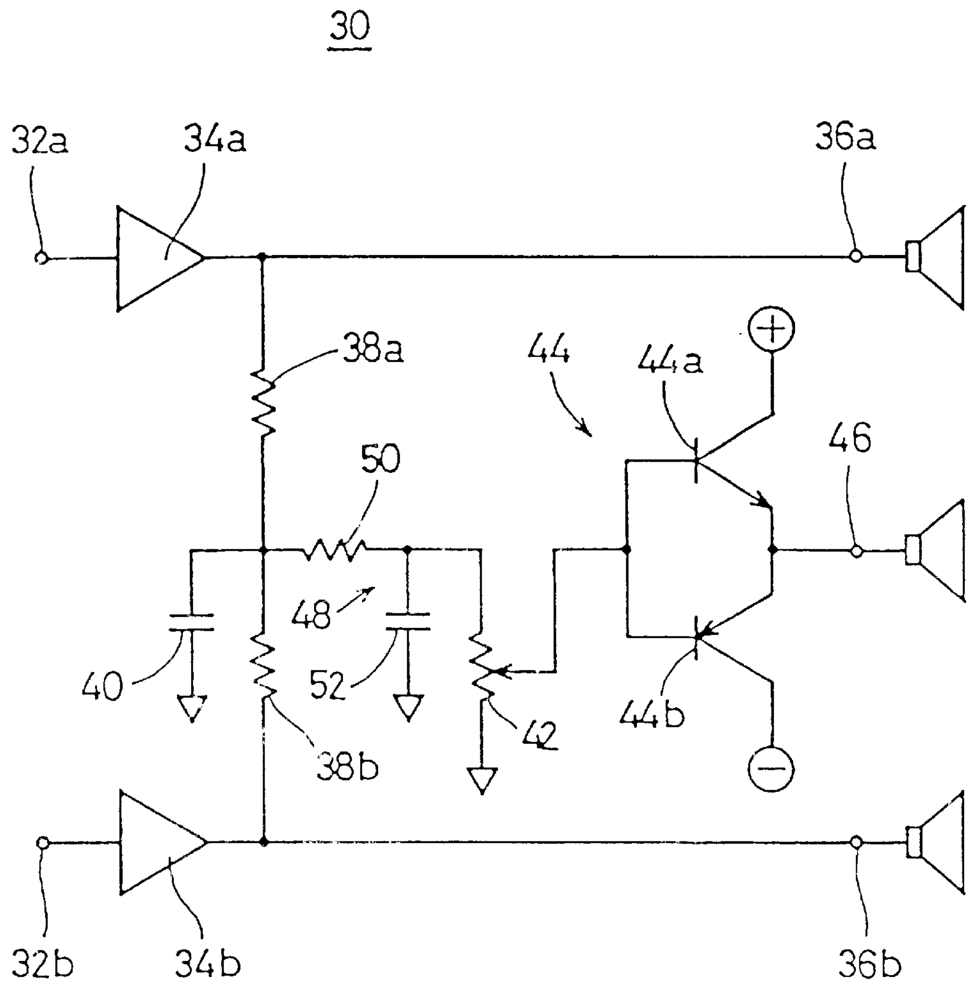
FIG. 2 is a circuit diagram illustrating another example of a 3D sound system using the 3D woofer drive circuit according to a preferred embodiment of the present invention.
Figure 3:
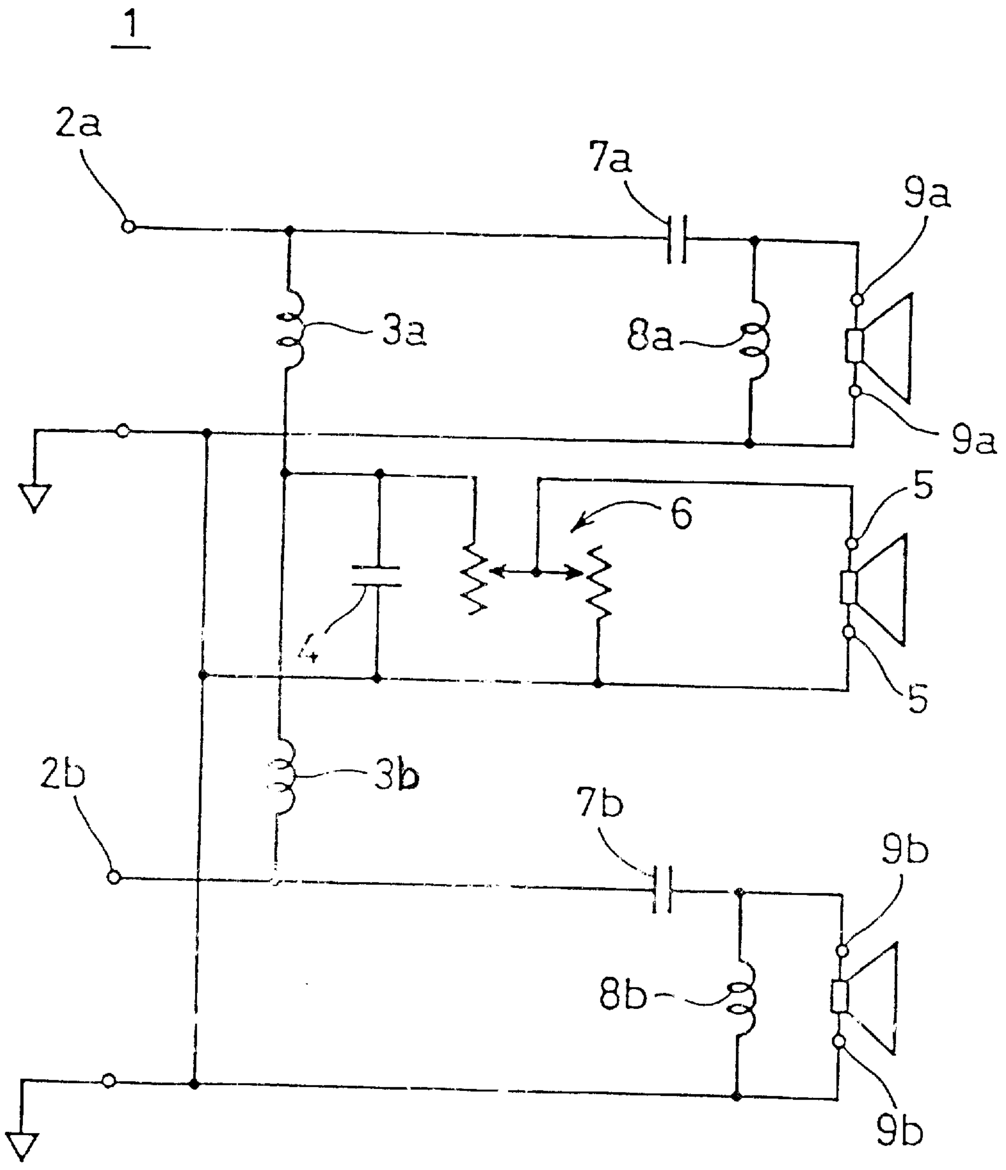
FIG. 3 PRIOR ART
FIG. 3 is a circuit diagram illustrating an example of a 3D sound system using a conventional 3D woofer drive circuit relating to a background of the present invention.
Figure 4:
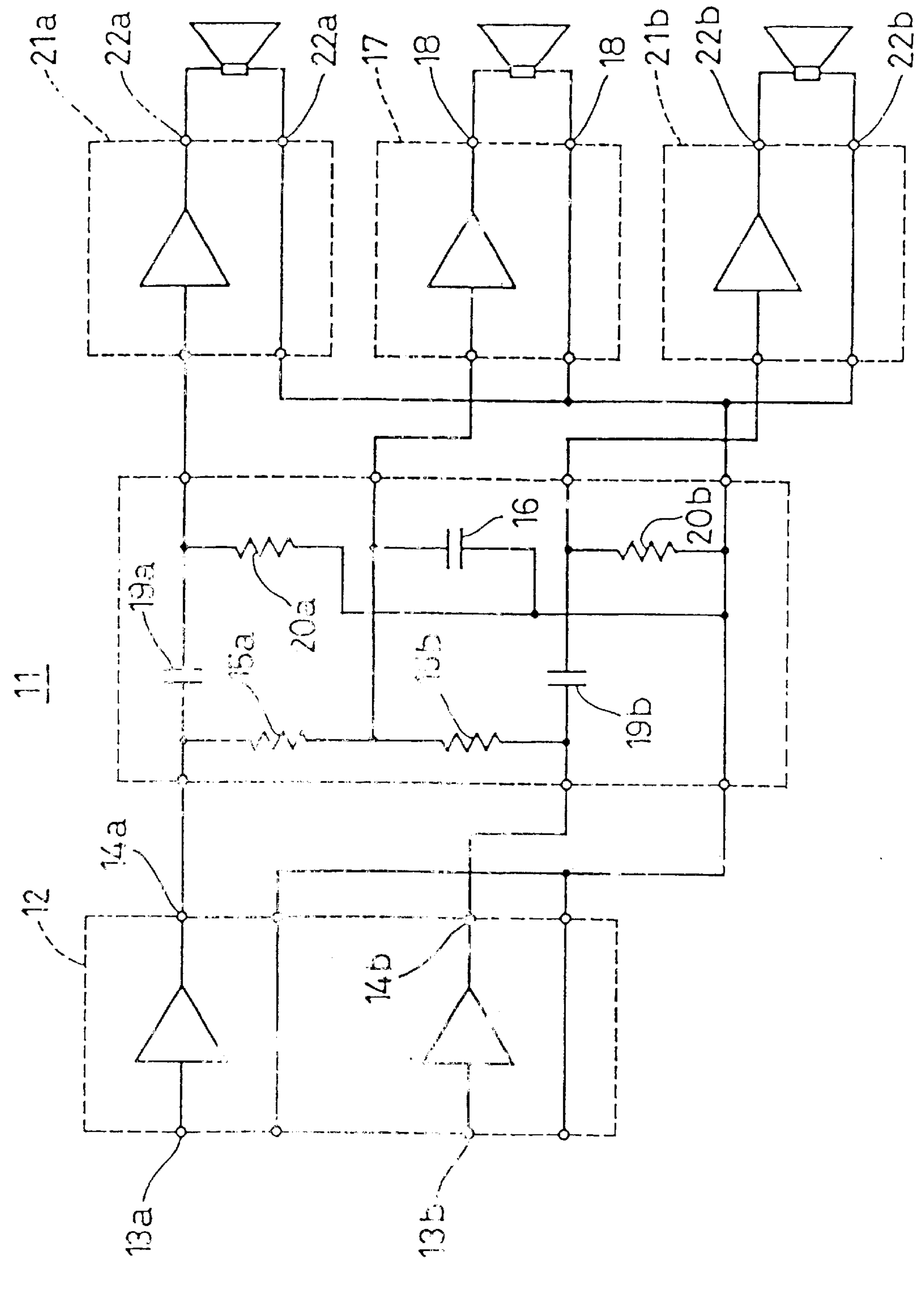
FIG. 4 PRIOR ART
FIG. 4 is a circuit diagram illustrating another example of a 3D sound system using a conventional 3D woofer drive circuit relating to a background of the present invention.

FIG. 2 is a schematic diagram illustrating another example of the 3D sound system using the 3D woofer drive circuit of preferred embodiments of the present invention. In the 3D sound system 30 illustrated in FIG. 2, in comparison with the 3D sound system 30 illustrated in FIG. 1, a low pass filter 48 is connected between the connection point of the two resistors 38*a* and 38*b* and the fixed terminal of the variable resistor 42 in the 3D woofer drive circuit to drive the woofer. The low pass filter 48 includes a resistor 50 and a capacitor 52, and the resistor 50 is connected between the connection point of two resistors 38*a* and 38*b* and the fixed terminal of the variable resistor 42, and the capacitor 52 is connected between the connection point of the variable resistor 42 to the resistor 50 and the ground terminal forming the reference potential.

The 3D sound system 30 illustrated in FIG. 2 is operated in a manner similar to the 3D sound system 30 illustrated in FIG. 1, and an effect is achieved in the 3D sound system 30 illustrated in FIG. 2 which is similar to that of the 3D sound system 30 illustrated in FIG. 1.

In each of the above-mentioned 3D sound systems 30, a resistor is used as an impedance element to synthesize the L-channel sound signal with the R-channel sound signal in the 3D woofer drive circuit, and an inductor or a capacitor other than the resistor may be used for such an impedance element.

In each of the above-mentioned 3D sound systems 30, one or two stages of a CR filter are used as a low pass filter in the 3D woofer drive circuit, and three or more stages of filters may be used for such a low pass filter, and an LC filter other than the CR filters may be used for such a low pass filter.

Still further, in each of the above-mentioned 3D sound systems 30, a variable resistor is used to control the tone by changing the level of the sound from the woofer in the 3D woofer drive circuit, and in place of such a variable resistor, a plurality of resistors and a change-over switch may be used so that the resistance is switched step-by-step, or the resistance is changed.

In the present invention, a 3D woofer drive circuit capable of miniaturizing the 3D sound system and reducing the cost thereof, can be obtained.

While the invention has been particularly shown and described with reference to preferred embodiments thereof, it will be understood by those skilled in the art that the foregoing and other changes in form and details may be made therein without departing from the spirit of the invention.

What is claimed is:

1. A drive circuit for a 3D sound system comprising:

a first amplifier arranged to provide an L-channel speaker terminal and a woofer terminal with an amplified L-channel sound signal from an L-channel sound signal source;

a second amplifier arranged to provide an R-channel speaker terminal and said woofer terminal with an amplified R-channel sound signal from an R-channel sound signal source;

an impedance element connected between said L-channel sound signal source and said L-channel speaker terminal and between said R-channel sound signal source and said R-channel speaker terminal, the impedance element being arranged to synthesize said amplified L-channel sound signal output by said L-channel sound signal source with said amplified R-channel sound signal output by said R-channel sound signal source; and a third amplifier arranged to output the sound signal synthesized by said impedance element to said woofer terminal; wherein the first amplifier is a final stage amplifier for the L-channel speaker terminal such that there is no amplifier between one end of the impedance element and the L-channel speaker terminal; and the second amplifier is a final stage amplifier for the R-channel speaker terminal such that there is no amplifier between another end of the impedance element and the R-channel speaker terminal.

2. The drive circuit for a 3D sound system according to claim 1, further comprising:

an L-channel speaker connected to said L-channel terminal to produce sound in a medium to high frequency range;

an R-channel speaker connected to said R-channel terminal to produce sound in a medium to high frequency range; and a woofer connected to said woofer terminal to produce sound in a low frequency range.

3. The drive circuit for a 3D sound system according to claim 1, wherein said impedance element includes a resistor, a capacitor connected to said resistor, and a low pass filter arranged to control the frequency of the sound signal to be output to said woofer terminal by said resistor and said capacitor.

4. The drive circuit for a 3D sound system according to claim 3, wherein said resistor is a variable resistor and is arranged to function as an attenuator and a tone control.

5. The drive circuit for a 3D sound system according to claim 1, wherein the impedance element comprises a low pass filter including two resistors and a capacitor.

6. The drive circuit for a 3D sound system according to claim 4, wherein the variable resistor includes a movable terminal, the woofer terminal is connected to the movable terminal of the variable resistor.

7. The drive circuit for a 3D sound system according to claim 6, wherein the third amplifier is a buffer amplifier, the woofer terminal is connected to the movable terminal of the variable resistor via the buffer amplifier.

8. The drive circuit for a 3D sound system according to claim 4, wherein the variable resistor includes a movable terminal which is adjustable so as to control tone.

9. The drive circuit for a 3D sound system according to claim 1, wherein the impedance element includes a resistor.

10. The drive circuit for a 3D sound system according to claim 1, wherein the impedance element includes a capacitor.

11. The drive circuit for a 3D sound system according to claim 1, wherein the impedance element includes an inductor.

12. The drive circuit for a 3D sound system according to claim 1, further comprising:

an L-channel speaker connected to said L-channel terminal to produce sound in a medium to high frequency range;

an R-channel speaker connected to said R-channel terminal to produce sound in a medium to high frequency range; and a woofer connected to said woofer terminal to produce sound in a low frequency range; wherein said impedance element includes a resistor, a capacitor connected to said resistor, and a low pass filter arranged to control the frequency of the sound signal to be output to said woofer terminal by said resistor and said capacitor.

13. The drive circuit for a 3D sound system according to claim 12, wherein said resistor is a variable resistor and is arranged to function as an attenuator and a tone control.

14. The drive circuit for a 3D sound system according to claim 1, further comprising:

an L-channel speaker connected to said L-channel terminal to produce sound in a medium to high frequency range;

an R-channel speaker connected to said R-channel terminal to produce sound in a medium to high frequency range; and a woofer connected to said woofer terminal to produce sound in a low frequency range; wherein the impedance element comprises a low pass filter including two resistors and a capacitor.

15. The drive circuit for a 3D sound system according to claim 13, wherein the variable resistor includes a movable terminal, the woofer terminal is connected to the movable terminal of the variable resistor.

16. The drive circuit for a 3D sound system according to claim 15, wherein the third amplifier is a buffer amplifier, the woofer terminal is connected to the movable terminal of the variable resistor via the buffer amplifier.

17. The drive circuit for a 3D sound system according to claim 13, wherein the variable resistor includes a movable terminal which is adjustable so as to control tone.

18. The drive circuit for a 3D sound system according to claim 1, further comprising:

an L-channel speaker connected to said L-channel terminal to produce sound in a medium to high frequency range;

an R-channel speaker connected to said R-channel terminal to produce sound in a medium to high frequency range; and a woofer connected to said woofer terminal to produce sound in a low frequency range; wherein the impedance element includes a resistor.

19. The drive circuit for a 3D sound system according to claim 1, further comprising:

an L-channel speaker connected to said L-channel terminal to produce sound in a medium to high frequency range;

an R-channel speaker connected to said R-channel terminal to produce sound in a medium to high frequency range; and a woofer connected to said woofer terminal to produce sound in a low frequency range; wherein the impedance element includes a capacitor.

20. The drive circuit for a 3D sound system according to claim 1, further comprising:

an L-channel speaker connected to said L-channel terminal to produce sound in a medium to high frequency range;

an R-channel speaker connected to said R-channel terminal to produce sound in a medium to high frequency range; and a woofer connected to said woofer terminal to produce sound in a low frequency range; wherein the impedance element includes an inductor.

21. A drive circuit for a 3D sound system comprising:

a first amplifier arranged to provide an L-channel speaker terminal and a woofer terminal with an amplified L-channel sound signal from an L-channel sound signal source;

a second amplifier arranged to provide an R-channel speaker terminal and said woofer terminal with an amplified R-channel sound signal from an R-channel sound signal source;

an impedance element connected between said L-channel sound signal source and said L-channel speaker terminal and between said R-channel sound signal source and said R-channel speaker terminal, the impedance element being arranged to synthesize said amplified L-channel sound signal output by said L-channel sound signal source with said amplified R-channel sound signal output by said R-channel sound signal source;

a third amplifier arranged to output the sound signal synthesized by said impedance element to said woofer terminal; wherein said impedance element includes a resistor, a capacitor connected to said resistor, and a low pass filter arranged to control the frequency of the sound signal to be output to said woofer terminal by said resistor and said capacitor;

the resistor is a variable resistor arranged to function as an attenuator and a tone control and includes a movable terminal;

the third amplifier is a buffer amplifier, the woofer terminal is connected to the movable terminal of the variable resistor via the buffer amplifier; and the buffer amplifier includes an NPN-type transistor and a PNP-type transistor.

22. The drive circuit for a 3D sound system according to claim 21, wherein a collector of the NPN-type transistor and a base of the PNP-type transistor are connected to the movable terminal of the variable resistor.

23. The drive circuit for a 3D sound system according to claim 21, wherein a collector of the NPN-type transistor is connected to a positive electric potential terminal and a collector of the PNP-type transistor is connected to a negative electric potential terminal.

24. A drive circuit for a 3D sound system comprising:

a first amplifier arranged to provide an L-channel speaker terminal and a woofer terminal with an amplified L-channel sound signal from an L-channel sound signal source;

a second amplifier arranged to provide an R-channel speaker terminal and said woofer terminal with an amplified R-channel sound signal from an R-channel sound signal source;

an impedance element connected between said L-channel sound signal source and said L-channel speaker terminal and between said R-channel sound signal source and said R-channel speaker terminal, the impedance element being arranged to synthesize said amplified L-channel sound signal output by said L-channel sound signal source with said amplified R-channel sound signal output by said R-channel sound signal source; and a third amplifier arranged to output the sound signal synthesized by said impedance element to said woofer terminal; wherein said impedance element includes a variable resistor arranged to function as an attenuator and a tone control, a capacitor connected to said variable resistor, and a low pass filter arranged to control the frequency of the sound signal to be output to said woofer terminal by said variable resistor and said capacitor; and the variable resistor includes a fixed terminal, the sound system further comprising two resistors and a low pass filter connected between a connection point of the two resistors and the fixed terminal of the variable resistor.

25. The drive circuit for a 3D sound system according to claim 24, wherein the resistor being connected at a connection point between the two resistors and the fixed terminal of the variable resistor and the capacitor being connected between the connection point of the variable resistor and a ground terminal.

26. A drive circuit for a 3D sound system comprising:

a first amplifier arranged to provide an L-channel speaker terminal and a woofer terminal with an amplified L-channel sound signal from an L-channel sound signal source;

a second amplifier arranged to provide an R-channel speaker terminal and said woofer terminal with an amplified R-channel sound signal from an R-channel sound signal source;

an impedance element connected between said L-channel sound signal source and said L-channel speaker terminal and between said R-channel sound signal source and said R-channel speaker terminal, the impedance element being arranged to synthesize said amplified L-channel sound signal output by said L-channel sound signal source with said amplified R-channel sound signal output by said R-channel sound signal source;

a third amplifier arranged to output the sound signal synthesized by said impedance element to said woofer terminal;

an L-channel speaker connected to said L-channel terminal to produce sound in a medium to high frequency range;

an R-channel speaker connected to said R-channel terminal to produce sound in a medium to high frequency range; and a woofer connected to said woofer terminal to produce sound in a low frequency range; wherein said impedance element includes a variable resistor arranged to function as an attenuator and a tone control, a capacitor connected to said resistor, and a low pass filter arranged to control the frequency of the sound signal to be output to said woofer terminal by said resistor and said capacitor;

the variable resistor includes a movable terminal;

the third amplifier is a buffer amplifier, the woofer terminal is connected to the movable terminal of the variable resistor via the buffer amplifier; and the buffer amplifier includes an NPN-type transistor and a PNP-type transistor.

27. The drive circuit for a 3D sound system according to claim 26, wherein a collector of the NPN-type transistor and a base of the PNP-type transistor are connected to the movable terminal of the variable resistor.

28. The drive circuit for a 3D sound system according to claim 26, wherein a collector of the NPN-type transistor is connected to a positive electric potential terminal and a collector of the PNP-type transistor is connected to a negative electric potential terminal.

29. A drive circuit for a 3D sound system comprising:

a first amplifier arranged to provide an L-channel speaker terminal and a woofer terminal with an amplified L-channel sound signal from an L-channel sound signal source;

a second amplifier arranged to provide an R-channel speaker terminal and said woofer terminal with an amplified R-channel sound signal from an R-channel sound signal source;

an impedance element connected between said L-channel sound signal source and said L-channel speaker terminal and between said R-channel sound signal source and said R-channel speaker terminal, the impedance element being arranged to synthesize said amplified L-channel sound signal output by said L-channel sound signal source with said amplified R-channel sound signal output by said R-channel sound signal source;

a third amplifier arranged to output the sound signal synthesized by said impedance element to said woofer terminal;

an L-channel speaker connected to said L-channel terminal to produce sound in a medium to high frequency range;

an R-channel speaker connected to said R-channel terminal to produce sound in a medium to high frequency range; and a woofer connected to said woofer terminal to produce sound in a low frequency range; wherein said impedance element includes a variable resistor arranged to function as an attenuator and a tone control, a capacitor connected to said resistor, and a low pass filter arranged to control the frequency of the sound signal to be output to said woofer terminal by said variable resistor and said capacitor; and the variable resistor includes a fixed terminal, the sound system further comprising two resistors and a low pass filter connected between a connection point of the two resistors and the fixed terminal of the variable resistor.

30. The drive circuit for a 3D sound system according to claim 29, wherein the resistor being connected at a connection point between the two resistors and the fixed terminal of the variable resistor and the capacitor being connected between the connection point of the variable resistor and a ground terminal.

* * * * *